(12) United States Patent
Faifer et al.

(10) Patent No.: US 7,019,513 B1
(45) Date of Patent: Mar. 28, 2006

(54) NON-CONTACT METHOD AND APPARATUS FOR MEASUREMENT OF SHEET RESISTANCE AND LEAKAGE CURRENT OF P-N JUNCTIONS

(76) Inventors: Vladimir Faifer, 1631 N. First St., San Jose, CA (US) 95112; Phuc Van, 1631 N. First St., San Jose, CA (US) 95112; Michael Current, 1631 N. First St., San Jose, CA (US) 95112; Timothy Wong, 1631 N. First St., San Jose, CA (US) 95112

( * ) Notice: Subject to any disclaimer, the term of this patent is extended or adjusted under 35 U.S.C. 154(b) by 0 days.

(21) Appl. No.: 11/040,791

(22) Filed: Jan. 19, 2005

(51) Int. Cl.
*G01R 31/28* (2006.01)
(52) U.S. Cl. .................................................. 324/158.1
(58) Field of Classification Search ................ 324/765, 324/750–752, 158.1, 715–719; 257/48; 438/16–17
See application file for complete search history.

(56) References Cited

U.S. PATENT DOCUMENTS

| 4,812,756 A | * | 3/1989 | Curtis et al. ................. 324/750 |
| 4,902,967 A | * | 2/1990 | Flesner ......................... 324/751 |
| 5,442,297 A | * | 8/1995 | Verkuil ......................... 324/702 |

* cited by examiner

*Primary Examiner*—Jermele Hollington
*Assistant Examiner*—Tung X. Nguyen

(57) ABSTRACT

A contactless sheet resistance measurement apparatus and method for measuring the sheet resistance of a surface p-n junction and its leakage current is disclosed. The apparatus comprises an alternating light source optically coupled with a transparent and conducting electrode brought close to the junction, a second electrode placed outside of the illumination area, and a third grounded electrode surrounding the first and second electrodes. For measurements of junction capacitance, a calibration wafer with known sheet resistance is used to provide reference photovoltage signals. Using the measurement of the junction photovoltage (JPV) signals from the illuminated area and outside this area for calibration and test wafers at different light modulation frequencies, p-n junction sheet resistance and conductance (leakage current density) are determined.

19 Claims, 5 Drawing Sheets

NON-CONTACT METHOD AND APPARATUS FOR MEASUREMENT OF SHEET RESISTANCE AND LEAKAGE CURRENT OF P-N JUNCTIONS

RELATED APPLICATIONS

U.S. application Ser. No. 10/688,766, Non Contact Method and Apparatus for Measurement of Sheet Resistance of P-N Junctions filed Oct. 15, 2003.

BACKGROUND OF THE INVENTION

The present invention relates to the non-contact measurement of the sheet resistance and leakage current of p-n junctions.

Advances in semiconductor technology have increased the requirements in monitoring epi and ion implant sheet resistance, Rs, in the range of 50 to greater than 10,000 Ohms/square, and also for the measurement of leakage current of p-n-junctions.

Currently, 4-point probe (4PP) techniques are widely used for sheet resistance measurements. In the case of ultra-shallow p-n junctions (with junction depths less than 30 nm) this technique has several disadvantages: mechanical probes can penetrate through the implant layer; and probe pressures necessary for making ohmic contact with an implant layer can increase p-n junction leakage between the implant layer and the underlying opposite conductivity substrate; also if a p-n junction is leaky, a 4PP probe can give erroneous values for sheet resistance even without probe penetration.

Various photo-electrical techniques have been proposed for non-contact measurement of p-n junctions which have limitations in the range of sheet resistance values which can be measured as well a numerous technical limitations on measurement accuracy and calibration.

The present invention uses a non-contact junction photo-voltage (JPV) technique for measurement of the sheet resistance and leakage current. JPV is the change of the near surface band bending or surface barrier under intensity modulated illumination of a p-n junction.

A non-contact JPV technique for measurement of sheet resistance in ultra shallow p-n junctions was proposed in Roger L. Verkuil, U.S. Pat. No. 5,442,297. This technique is based on the measurement of JPV signals remote from a local illumination area. To detect the attenuation and phase monitoring, the apparatus included two conducting rings placed in the vicinity of the wafer surface outside the illumination area. Using the measurement of two AC signals outside the illumination region and additional junction capacitance data, the sheet resistance can be calculated.

This technique has the following disadvantages. Since only attenuated JPV signals are measured outside the illumination area, this approach does not provide good spatial resolution and high sensitivity for measurements of sheet resistance Rs<400 Ohms/square in ultra shallow p-n junctions formed with high dose implants. The measurement is based on a small signal, linear JPV theory. According to this theory, the JPV signal should be linear with light intensity not only outside of the illumination area but also inside this area. The technique presented in U.S. Pat. No. 5,442,297 uses measurements only outside the illumination area. The calculation of sheet resistance is based on a simplified model valid only for infinitely thin metal rings electrodes. As a result, this model will give additional systematic errors because the capacitance of these thin electrodes depends upon non-linear fashion on their distance from the wafer surface and the linearity condition is not checked within the illumination area. This probe configuration does not allow one to produce accurate measurements close to the edge of the wafer. Another disadvantage of this patent is the requirement for the use of additional means for measurements of the p-n junction capacitance, or information about this value in order to calculate sheet resistance values. Also this technique does not provide for measurement of p-n junction conductance (leakage)—an important parameter for USJ process.

The advantages of present invention are a method and apparatus for accurate measurements of sheet resistance, capacitance of p-n junctions and determination of leakage currents with improved spatial resolution and sensitivity.

SUMMARY OF THE INVENTION

An object of this invention is to provide a non-contact sheet resistance and leakage current apparatus for the measurement of doped surface layers over a wide range of doping levels. The present embodiment of the invention apparatus includes a means for illumination of p-n junctions with intensity modulated light, a transparent and conducting electrode, positioned near the surface of the semiconductor wafer directing light onto its surface, and detecting JPV signal from said area. The present invention also includes a second electrode detecting JPV signal outside the illumination area. The second electrode can be a metal arc, which can be positioned over the wafer area, even if the light spot and transparent electrode are located at the edge of the wafer. Using this configuration for the second electrode, the edge effect area is significantly decreased. The present invention also includes a third, grounded electrode surrounding the first and second electrodes to prevent influence of JPV from regions of the wafer outside of the area of the first and second electrodes. The present invention also includes two preamplifiers connected to the first and second electrodes.

To obtain accurate measurements, the intensity of the light is adjusted to obtain a linear dependence of the JPV signal from the transparent electrode versus light flux.

This method provides for calibration of the junction capacitance measurement using a wafer with known sheet resistance. The method is based on comparison of JUV signal for test wafers and a calibration wafer with sheet resistance measured using a 4PP. The calibration wafer should have a thick enough p-n junction depth (>50 nm) to provide accurate 4PP measurements without interference from junction leakage or probe punch through effects.

The procedure of measurement includes illumination the area of the calibration semiconductor p-n structure with known sheet resistance with intensity modulated light; measurement of JPV from some area inside the illumination area and some area outside of the illumination area of the calibration wafer at one or two frequencies; measurement of JPV and its phase shift from some area inside the illumination area and some area outside of the illumination area of the test wafer with at least two frequencies; determination of the capacitance of a p-n junction of the calibration wafer using its known sheet resistance and measured its JPV values; and determination of the sheet resistance and leakage current of test wafers using measured JPV values from test wafers at two or more frequencies and JPV values from a calibration wafer.

The present invention also provides a means for increasing the accuracy and versatility of the measurement through several methods; providing a means for checking and adjusting the air gap separation between the probe electrodes and the p-n-junction to establish uniform and known capacitive coupling of the JPV signals, and providing a photodiode detector to check the value and uniformity of the surface reflectivity and providing for the use of multiple wavelengths of excitation light to allow for optimal matching between the light penetration depth and junction depths of surface and sub-surface doped layers.

DETAILED DESCRIPTION OF THE APPARATUS AND METHOD

Figure 1:
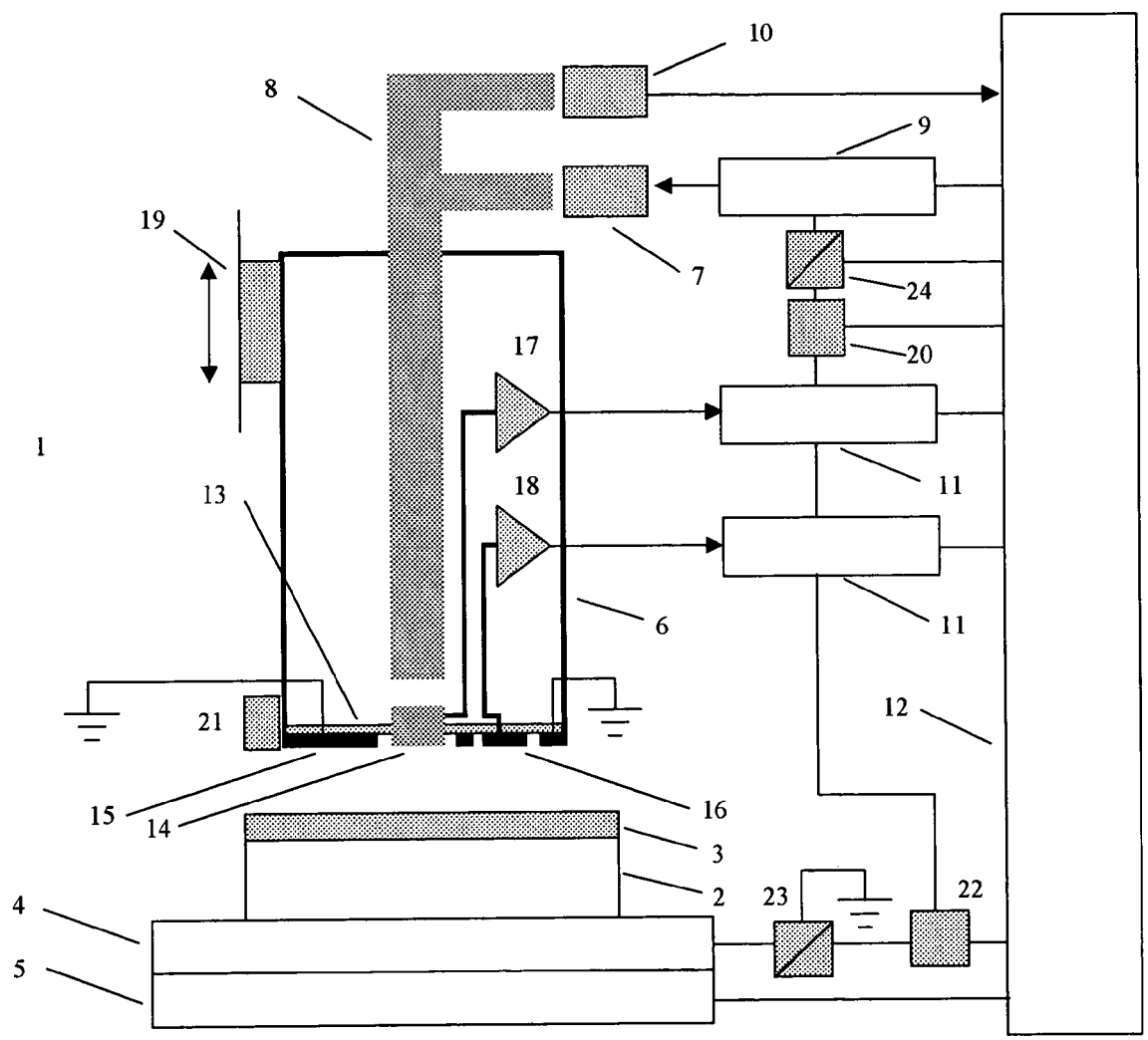
FIG. 1 is a pictorial view of the present embodiment of the invention.

In FIG. 1, a contactless sheet resistance measurement apparatus 1 is shown. A wafer 2 containing a surface p-n-junction 3 is placed on a wafer chuck 4. The wafer chuck is placed on a rotary and linear motion stage 5. The apparatus comprises a probe 6 for sheet resistance (Rs) and leakage current (L) measurement (RsL), which is placed close to the junction surface and optically coupled through a fiber bundle 8 with an LED 7, connected to the LED driver 9. A signal generator 20 is used to supply the modulated signal to the LED driver 9. Two electrical JPV outputs from the probe 6 are connected to signal demodulators 11. Signal generator 20, signal demodulators 11 and motors of the stage 5 are electrically connected to an interface and computer 12. The chuck 4 is normally connected to the ground through switch 23 during the measurement of JPV signals. The system controller 12 also controls a second signal generator 22 which can supply a modulated signal to the wafer chuck 4 through switch 23 for monitoring of the air gap distance between electrodes and top surface of the wafer 2, in the absence of the LED light beam, when generator 20 is disconnected from LED driver 9 by switch 24. In this case signal from demodulator 11 will be inversely proportional to the air gap. When performing the probe-wafer distance sensing, the computer control switch 23 connects generator 22 to chuck 4 and a switch 24 disconnects to the signal generator 20 from LED driver 9. On the other hand, in measuring the JPV signals, switch 24 connects the signal generator 20 to LED driver 9 while the other switch 23 connects chuck 4 to ground. The signal generator 20 and signal demodulators 11 may be replaced by a single lock-in amplifier with an internal signal generator.

Figure 3:
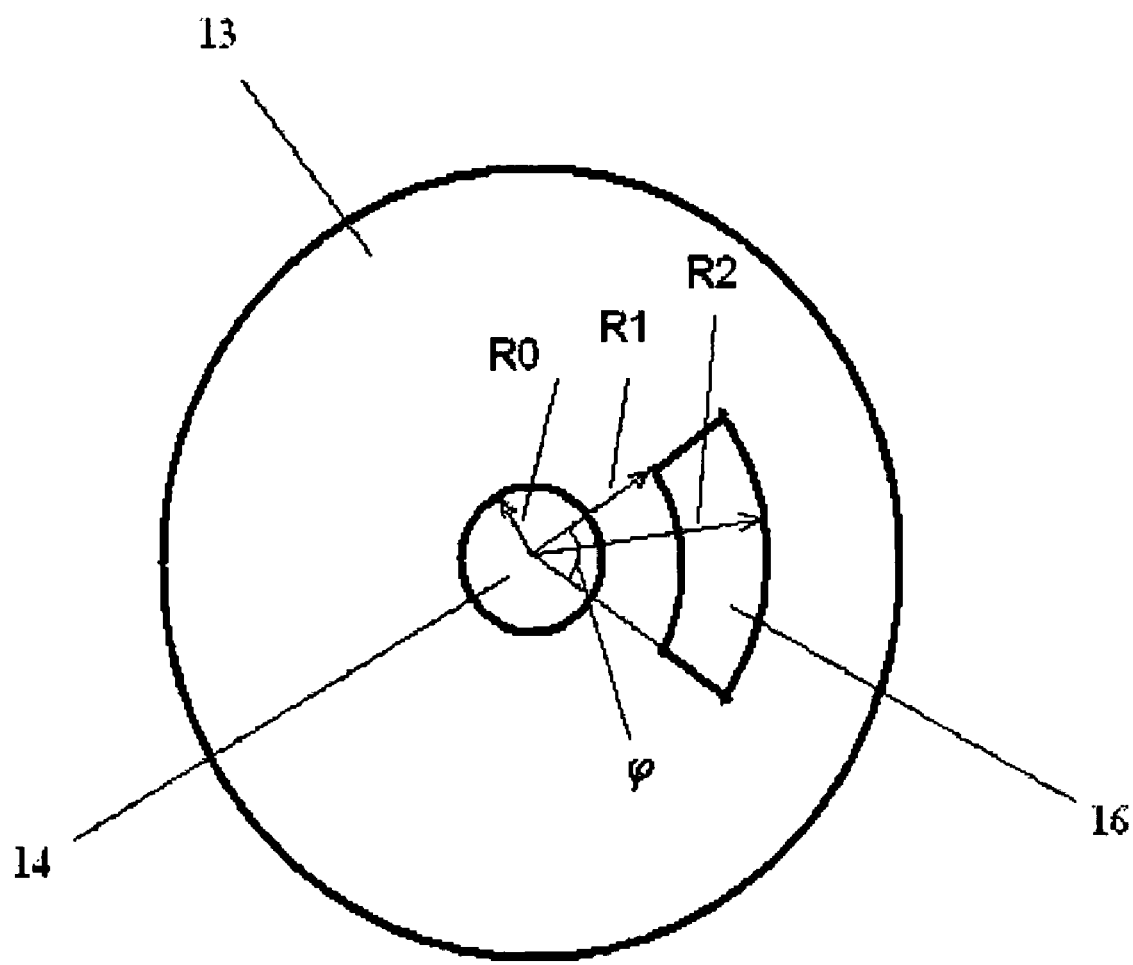
FIG. 3 is a pictorial view of the configuration of the RsL probe's electrodes.
Figure 4:
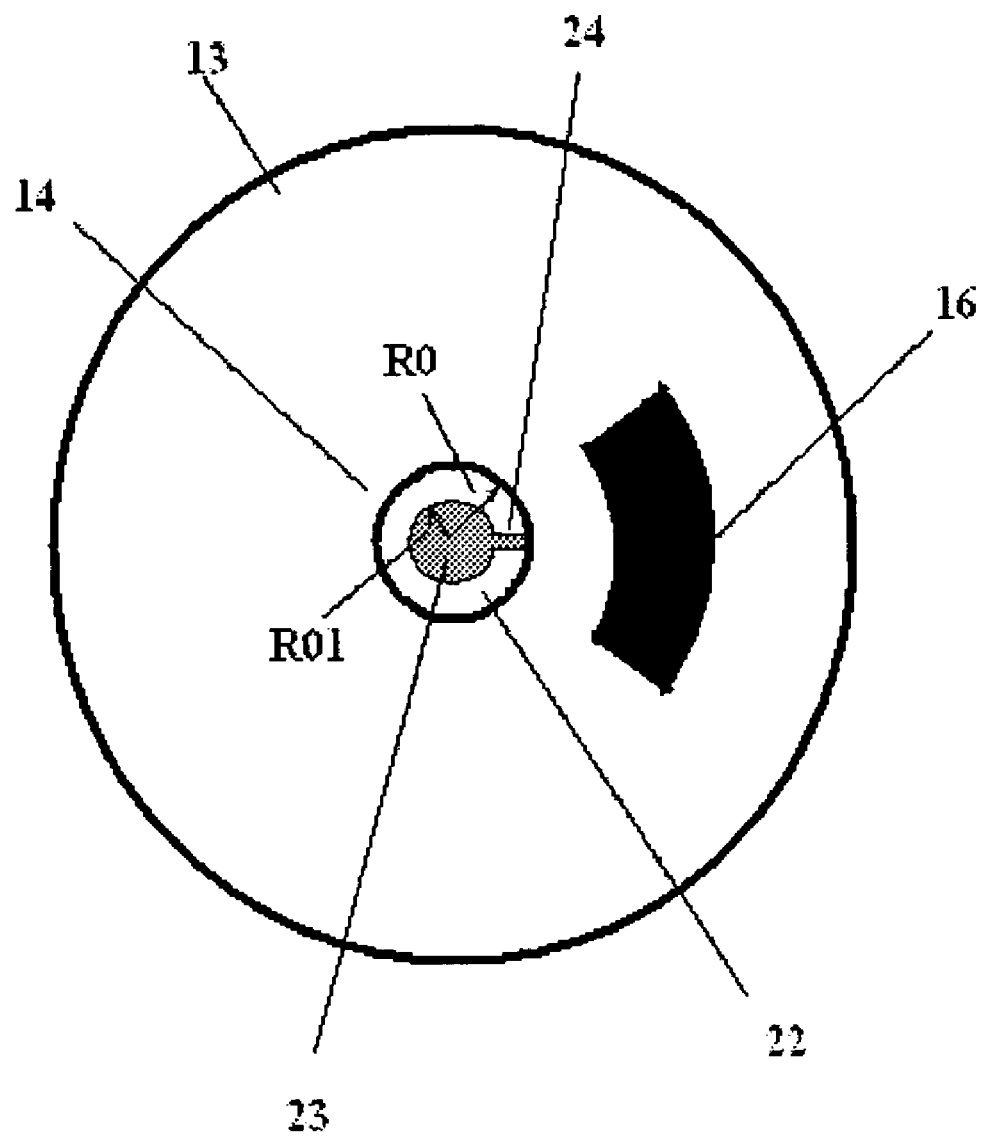
FIG. 4 is a pictorial view of the configuration of the RsL probe's electrodes with transparent electrode covering some part of the glass.

The air gap distance between the probe electrodes 14, 16 and the p-n junction 3 is controlled through vertical motion control 19 and gap sensor 21 to establish a known and uniform capacitive coupling for the JPV signal. The fiber bundle 8 also communicates the LED light to the p-n junction 3 and back to a photodiode detector 10 for measurement of the surface reflectivity. The RsL probe 6 and p-n junction 3 are placed during sheet resistance and leakage current measurements in a light-tight enclosure to avoid noise effects from additional photovoltage signals created by light sources other than the modulated LED source 7. The RsL probe represented in FIG. 2 comprises of three electrodes and two preamplifiers. The RsL probe 6 includes a dielectric ring 13, a first electrode with a glass disk with a transparent and conducting ITO (Indium-Tin-Oxide) coating 14, a second metal electrode 16 shaped as a partial ring around the first electrode 14 and a third grounded metal electrode 15 covering the area outside the first and second electrodes to prevent the influence of the photovoltage outside the areas of these electrodes on the JPV signals captured by these electrodes. The conducting layer of the glass disk 14 is connected to a preamplifier 17, a metal electrode 15 is grounded and a metal electrode 16 is connected to the preamplifier 18. The output of preamplifiers 17, 18 is connected to signal demodulators 11. The parameters of the electrodes 14,16 (radius R0, R1, R2 and angle φ) are shown in FIG. 3. In FIG. 4 another electrode configuration is shown, where the transparent circular conducting coating 26 with a radius $R_{01}$ is covering only the part of the quartz or glass cylinder 25. The transparent conducting stripe 27 is used for connecting the electrode 26 to a preamplifier 17. The grounded electrode 15 is not shown in FIGS. 3 and 4.

Figure 5:
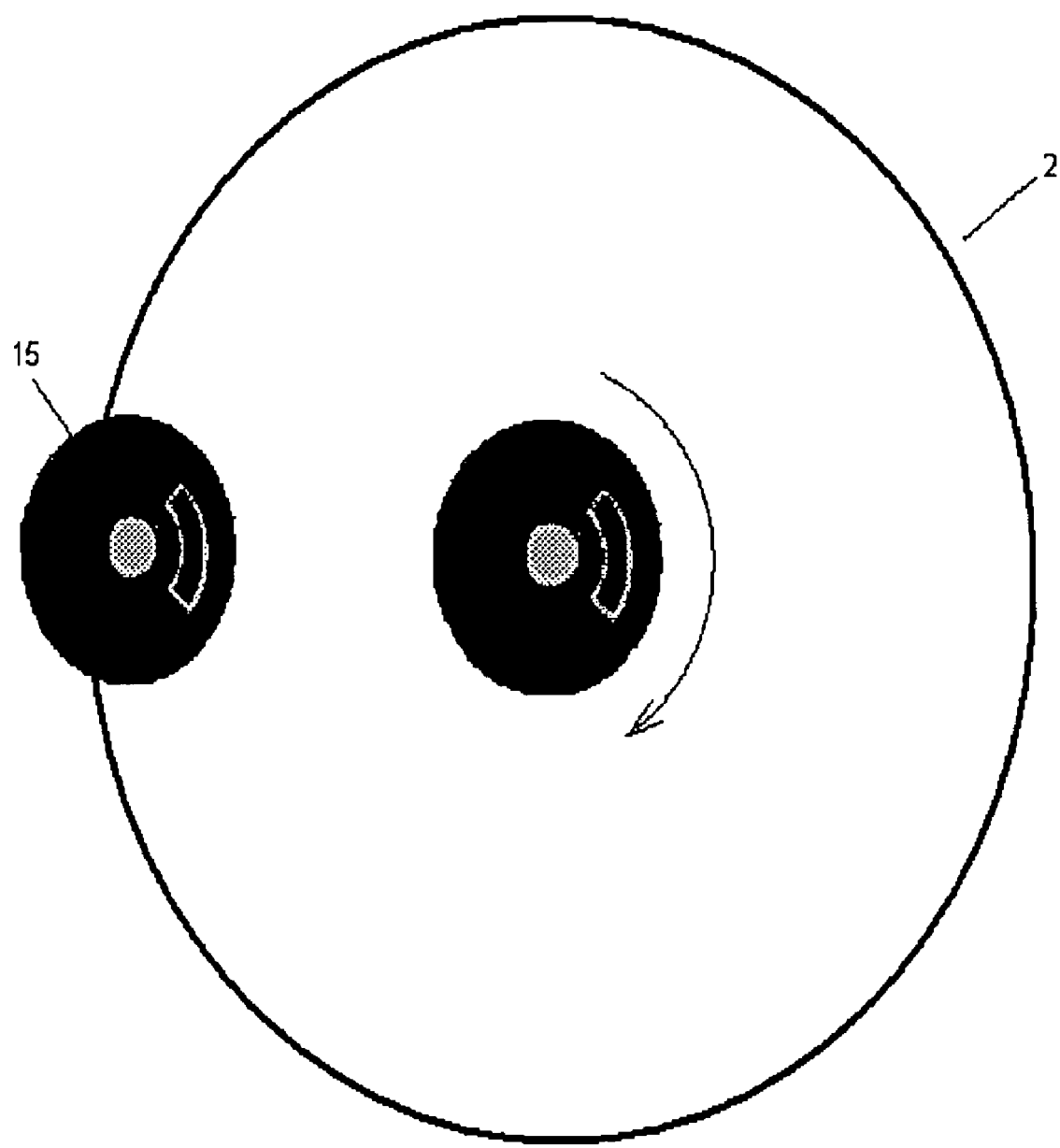
FIG. 5 is a pictorial view of the configuration of SPV electrodes with respect to the wafer.

As shown in FIG. 5, mapping of the wafer is done by rotating the wafer and translating the wafer in the X direction. The non-transparent electrode is positioned in the negative x direction. This electrode configuration provides for mapping of the sheet resistance with a much smaller edge exclusion region than for ring-like electrode configurations.

Figure 2:
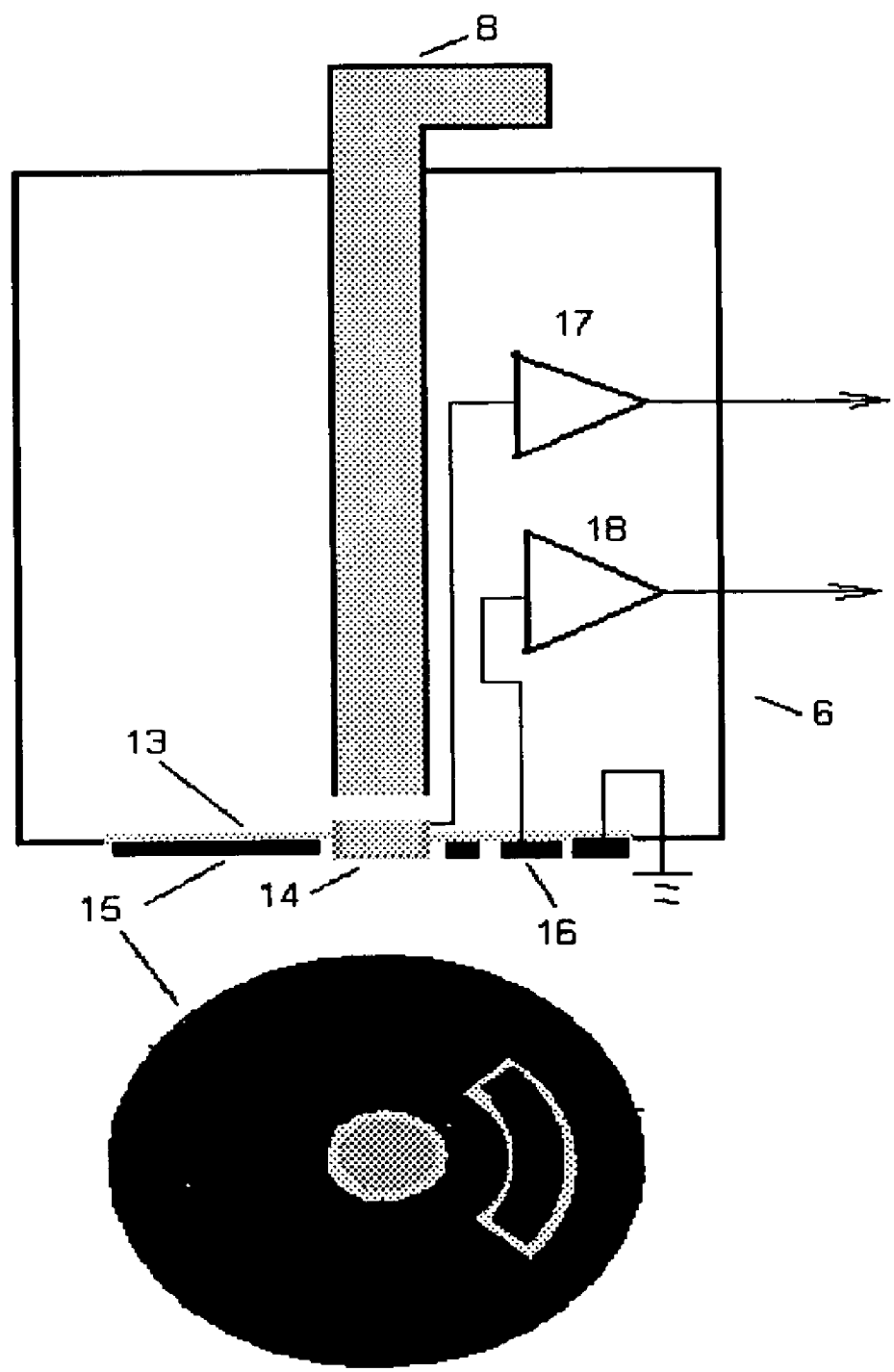
FIG. 2 is a pictorial view of an RsL probe configuration.

The basis of the measurement is to use photo-excitation of carriers in the junction and wafer substrate and to monitor, in a spatially resolved manner, the generation and drift of carriers with two electrodes, a transparent electrode 14 at the center of the probe and second electrode 16 some small distance away (FIG. 2). The background of the measurement is related to the theory of surface photovoltage (SPV) distributions under local optical excitation of silicon wafers under strong inversion at the surface described in V. Faifer et. al., "Measurement of the diffusion length with improved spatial resolution", *Proceedings of $24^{th}$ ESSDERC '94*, Edinburgh, p. 601 (1994). The equation for the SPV value as function of coordinates x,y in the case of a semiconductor with strong inversion is derived in this article. After some modification this equation can be written for p-n junction photovoltage (JPV) as:

$$\frac{\partial^2 v_{SPV}}{\partial x^2} + \frac{\partial^2 v_{SPV}}{\partial y^2} = Rs \cdot Cs \cdot \frac{\partial v_{SPV}}{\partial t} + Rs \cdot G \cdot v_{SPV} - q \cdot \varphi \cdot (1-R) \cdot Rs \quad (1)$$

where: $v_{SPV}(x,y,t)$ is junction photovoltage value as function of coordinates x,y;

$\phi(x,y,t)$ is the intensity of light flux;

Rs is the sheet resistance of the upper layer of p-n structure;

Cs is the capacitance of p-n junction per unit area;

G is the conductivity of p-n junction per unit area;

R is reflectivity of semiconductor.

The conductivity of p-n junction can be determined as:

$$G = \frac{I_0 \cdot q}{k \cdot T} \quad (2)$$

where q is charge of the electron;

k is Boltzman constant;

T is the temperature;

Io is the prefactor in formula of current, I, versus voltage, V, of p-n junction:

$$I = I_o \cdot [\exp(q \cdot V/kT) - 1] \quad (3)$$

The phovoltage signal can be calculated using the formula:

$$V_{SPV}(t) = \text{Const} \int \int_S v_{SPV}(x, y, t) \, dx \, dy \quad (4)$$

where S is the area of electrode and Const depends on the air gap between electrode and the semiconductor surface, the gain of amplification of the preamplifier and others parameters.

In the case of sinusoid modulated light, the JPV signal can be represented as:

$$V_{SPV}(t) = V_S \cdot \exp(j\omega \cdot t) = |V_S| \exp(j\theta) \exp(j\omega \cdot t) \quad (5)$$

where $|Vs|$, $\theta$ are the magnitude and phase shift of JPV signal, Vs, $\omega = 2\pi f$, f is light modulating frequency.

Using equations (1) and (5), we can derive the magnitudes of JPV signals from transparent electrode 14, $V_1$, and non-transparent electrode 16, $V_2$, for probe configuration, represented in FIGS. 2 and 3:

$$V_1 = \left| \frac{q\Phi R_S}{k^2} \left[ 1 - \frac{2}{kR_0} \frac{I_1(kR_0)K_1(kR_0)}{I_0(kR_0)K_1(kR_0) + I_1(kR_0)K_0(kR_0)} \right] \right| \quad (6)$$

$$V_2 = \frac{\varphi}{2\pi} \left| 2q \frac{\Phi R_S}{k^3 R_0^2} \frac{I_1(kR_0)[R_1 K_1(kR_1) - R_2 K_1(kR_2)]}{I_0(kR_0)K_1(kR_0) + I_1(kR_0)K_0(kR_0)} \right| \quad (7)$$

where $$k = \sqrt{R_S G + j 2\pi f s C s} \quad (8)$$

$$j = \sqrt{-1}$$

$I_0(z)$, $I_1(z)$, are the modified Bessel function of the first kind;

$K_0(z)$, $K_1(z)$ are the modified Bessel function of the second kind;

$R_0$ is the radius of the first transparent electrode;

$R_1$, $R_2$ are the inner and outer radiuses of the second non transparent electrode;

$\Phi$ is the effective light flux propagating inside semiconductor.

$\varphi$ is the angle of the metal arc electrode 16, represented in FIG. 3.

It is not sufficient to measure only the photovoltages $V_1$, $V_2$ to determine three parameters Rs, G and Cs of a test wafer with a p-n junction. In this invention we provide for the use of a junction capacitance calibration wafer to provide for accurate measurement of sheet resistance and leakage current. The calibration wafer should have a surface p-n junction with low leakage current, $G_{sc} << 2\pi_2 C_{sc}$, and a well-characterized sheet resistance Rsc. The sheet resistance of this calibration wafer can be measured for example using a 4PP. The calibration wafer should have a thick enough p-n junction (>50 nm) to avoid contact probe punch through and leakage current issues. The photovoltage signals from the two electrodes V1c and V2c are measured at frequency $f_1$ and the junction capacitance Csc of the calibration wafer is calculated using equation:

$$\frac{V_{1C}}{V_{2C}} = \frac{2\pi}{\varphi} \left| \frac{1}{2} k_C R_0^2 \frac{K_1(k_C R_0) I_0(k_C R_0) + K_0(k_C R_0) I_1(k R_0) - (1/2 k_C R_0) K_1(k_C R_0) I_1(k_C R_0)}{I_1(k_C R_0)[R_1 \cdot K_1(k_C R_1) - R_2 K_1(k_C R_2)]} \right| \quad (10)$$

where $k_C = \sqrt{j 2\pi_1 R_{sc} C_{sc}}$ (11)

After this, photovoltage signals $V_{11}$ and $V_{21}$ from transparent electrode 14 and non transparent electrode 16 are measured at frequency $f_1$ for test wafers with unknown parameters. The analysis is then repeated for a lower light modulation frequency $f_2$, where the decay term parameters, Rs*G, in (9) and hence leakage effect in is more dominant factor. The new junction photovoltages $V_{12}$ and $V_{22}$ are measured at frequency $f_2$.

To exclude errors related to wafers thickness differences, or change of the air gap due to differential thermal expansion of different components, an air gap control system is used to maintain a constant air gap or to monitor the air gap and mathematically correct the JPV signals. A distance sensor 21 is used to measure the gap between the sample and the probe; it can be optically based, for example, a laser interferometer or electrically based measuring the capacitance between the electrodes and the surface junction. The distance information is send back to the computer 12 and the computer will send a signal to the Z motor 19 that moves the probe up and down to compensate for the air gap variation. Distance sensing means comprises a signal generator 22 that applies an AC voltage through switch 23 to the wafer chuck 4. The signal, from electrode 14, preamplifier 17 and demodulator 11 is inversely proportional to the air gap. For a system that has good temperature compensation, the air gap can be controlled by measuring this signal, Vt and Vc, before JPV test wafer measurements, variations in probe gain and capacitance can be taken into account in the calculation of Rs.

The parameters Rs, Cs, G of the test wafer can be determined using measured values for calibration and test wafers at frequencies $f_1$ and $f_2$ and the set of equations:

$$\frac{V_{11}}{V_{21}} = \frac{2\pi}{\varphi} \left| \frac{1}{2} k_1 R_0^2 \frac{K_1(k_1 R_0) I_0(k_1 R_0) + K_0(k_1 R_0) I_1(k_1 R_0) - (1/2 k_1 R_0) K_1(k_1 R_0) I_1(k_1 R_0)}{I_1(k_1 R_0)[R_1 \cdot K_1(k_1 R_1) - R_2 K_1(k_1 R_2)]} \right| \quad (12)$$

$$\frac{V_{11}}{V_{1C}} = \frac{Rs}{Rsc} \frac{V_T}{V_C} \left| \frac{k_C^2 \left[ 1 - \frac{2}{k_1 R_0} \frac{I_1(k_1 R_0) K_1(k_1 R_0)}{I_0(k_1 R_0) K_1(k_1 R_0) + I_1(k_1 R_0) K_0(k_1 R_0)} \right]}{k_1^2 \left[ 1 - \frac{2}{k_C R_0} \frac{I_1(k_C R_0) K_1(k_C R_0)}{I_0(k_C R_0) K_1(k_C R_0) + I_1(k_C R_0) K_0(k_C R_0)} \right]} \right| \quad (13)$$

$$\frac{V_{21}}{V_{22}} = \left| \frac{k_2^3}{k_1^3} \frac{\frac{I_1(k_1R_0)[R_1K_1(k_1R_1) - R_2K_1(k_1R_2)]}{I_0(k_1R_0)K_1(k_1R_0) + I_1(k_1R_0)K_0(k_1R_0)}}{\frac{I_1(k_2R_0)[R_1K_1(k_2R_1) - R_2K_1(k_2R_2)]}{I_0(k_2R_0)K_1(k_2R_0) + I_1(k_2R_0)K_0(k_2R_0)}} \right| \quad (14)$$

where $$k_1 = \sqrt{RsG + j2\pi f_1 RsCs} \quad (15)$$

$$k_2 = \sqrt{RsG + j2\pi f_2 RsCs} \quad (16)$$

Vc=capacitance signal from signal demodulator 11 for a calibration wafer

Vt=capacitance signal from signal demodulator 11 for a wafer under test.

If feedback control is used then Vc/Vt=1.0.

The sheet resistance and leakage current also can be determined using additional measurements of the phase shifts of the JPV signals. The parameters Rs, Cs, G of the test wafer can be determined using measured values for calibration and test wafers at frequencies $f_1$ and $f_2$ and the set of equations (12), (13) and equation:

$$\theta_{12} - \theta_{22} = \mathrm{Arg}\left[ \frac{1}{2} k_2 R_0^2 \frac{K_1(k_2R_0)I_0(k_2R_0) + K_0(k_2R_0)I_1(k_2R_0) - (1/2k_2R_0)K_1(k_2R_0)I_1(k_2R_0)}{I_1(k_2R_0)[R_1 \cdot K_1(k_2R_1) - R_2K_1(k_2R_2)]} \right] \quad (17)$$

where $\theta_{12}$ and $\theta_{22}$ are the phase shifts of JPV signals from the transparent 14 and non transparent electrodes 16 at frequency $f_2$.

In more detail, the first procedure of measurement includes the steps of:

a) Put the calibration semiconductor p-n structure with known sheet resistance Rsc on the wafer chuck.

b) Determine the electrode to sample spacing and capacitance signal Vc, using voltage generator 22.

c) Illuminate the area of the sample through transparent electrode 14 from LED 7 with intensity modulated light at a maximum frequency, $f_{max}$, consistent with the bandwidth of JPV preamplifier 17 and signal demodulator 11;

d) Measure the JPV signals, $V_{1C}$ and $V_{2C}$ at frequency $f_{max}$ from electrodes 14 and 16 respectively using preamplifiers 17 and 18 and signal demodulators 11;

e) If $V_{2C}$ is close to the noise limit of preamplifier 18, $V_{2n}$, decrease the light modulating frequency to get $V_{2C} > V_{2n}$ and measure JPV signals $V_{1C}$ and $V_{2C}$ at this modulating frequency, $f_1$;

f) Adjust the light flux to get a linear dependence of the JPV signal, $V_{1C}$, versus light flux and measurement JPV signals $V_{1C}$, $V_{2C}$;

f) Replace the calibration sample with the wafer under test.

g) Measure the electrode to sample spacing and capacitance signal Vt.

h) Use the electrode to wafer spacing information to move the Z motor 19 to maintain a standard probe sample spacing for calibration sample or determine the normalization factor for JPV.

i) Repeat the steps c), d), e), f) for test wafer and measure JPV signals $V_{11}$ wand $V_{21}$; at frequency $f_1$;

j) Decrease the light modulating frequency to $f_2$, repeating steps c), d), e), f) for test wafer and measurement of JPV signals $V_{12}$ and $V_{22}$; at frequency $f_2$;

k) Determine the capacitance Csc of the calibration wafer using its sheet resistance Rsc, measured values $V_{1C}$, and $V_{2C}$ at frequency $f_1$ and equation (10);

l) Determine of Rs and Gs using parameters of calibration structure Rsc, Csc, measured values from test wafer $V_{11}$, and $V_{21}$, at frequency $f_1$ and $V_{12}$, and $V_{22}$, at frequency $f_2$ and from calibration wafer test wafer $V_{1C}$ at frequency $f_1$ and equations (12), (13), (14).

For high throughput, an LED driver 9 and signal demodulators 11 capable of handling two or more frequencies can be used simultaneously, this reducing steps k) and l) into a single step.

The second procedure of measurement requires additional measurement of phase shifts, $\theta_{12}$ and $\theta_{22}$, of the JPV signals from the transparent 14 and non-transparent electrodes 16 at frequency $f_2$ using preamplifiers 17, 18 and signal demodulators 11. Rs and Gs are determined using parameters of calibration structure Rsc, Csc, measured values from test wafer $V_{11}$, and $V_{21}$, at frequency $f_1$ and $V_{12}$, $\theta_{12}$ and $V_{22}$, $\theta_{22}$ at frequency $f_2$ and from calibration wafer test wafer $V_{1C}$ at frequency $f_1$ and equations (12), (13), (17).

The dimensions of electrodes R0, R1, R2 can be chosen in the mm range to get optimal spatial resolution and reproducibility of Rs measurement of the order of 0.1% in the range of Rs=10 to >100,000 Ohms/sq. The wavelength of the light source should be less then 800 nm for Si wafers to exclude the effects of diffusion of optically generated carriers from deep in the substrate. LEDs with power of about 1 mW and modulating frequency in the range of 1–100 kHz are used for measurement of sheet resistance and leakage current density in the $10^{-3}$ to $10^{-7}$ A/cm$^2$ range.

What is claimed is:

1. A contactless method for measurement of sheet resistance p-n junction top layer and its leakage current, comprising:

illumination of an area of a semiconductor p-n junction with intensity modulated light and monitoring photovoltages from illumination area and some area outside of said illumination area, measurement of reference photovoltages from reference p-n structure with known sheet resistance at least at one frequency, measurement of said photovoltages from test p-n structure at least at two frequencies, and determination of the sheet resistance and leakage current of test wafer using said photovoltages and reference photovoltages and sheet resistance of reference sample.

2. The contactless method for measurement of sheet resistance of a surface p-n junction and its conductance of claim 1, wherein in addition to photovoltages, its phase shifts are measured and the sheet resistance and leakage current of the test wafer is determined using said photovoltages, phase shifts and reference photovoltages.

3. The contactless method of claim 1, wherein the distance between the p-n junction and electrode is monitored and adjusted and used for correction of junction photovoltages for test and reference wafers.

4. The contactless method of claim 1, wherein the photovoltage monitoring area inside said illumination area is less than the illumination area.

5. The contactless method of claim 1, wherein light flux reflected from wafer is measured to correct photovoltages from reference and test wafers, taking into account reflectivity differences between these wafers.

6. The contactless method of claim 1, wherein said reference p-n junction is not leaky, with leakage $I<10^{-7}$ $A/cm^2$.

7. The contactless method of claim 1, wherein said reference p-n junction structure is measured using a 4PP.

8. The contactless method of claim 1, wherein said p-n junction structure is illuminated simultaneously by two light fluxes, modulated at different frequencies and simultaneously detecting these photovoltages.

9. A contactless apparatus for measuring sheet resistance and leakage current comprising:
   means for illuminating the area of semiconductor structure with intensity modulated light through a transparent conducting electrode,
   means for detecting JPV signal inside said illumination area and optically coupled to said illuminating means,
   means for detecting JPV signals outside said illumination area with a nontransparent electrode,
   means for measurement of said JPV signals inside and outside the said illumination area connected to said means for detecting JPV signals,
   means for monitoring and compensating for air gap variation due to wafer thickness variation or a non-leveled wafer chuck, and
   means for calibration of surface reflectivity of test wafers.

10. The contactless sheet resistance measurement apparatus of claim 9, wherein said transparent conducting electrode is a glass or quartz disk with an ITO coating and the non-transparent electrode is a metal arc coaxially installed to said glass or quartz disk, and a grounded electrode is surrounding these electrodes.

11. The contactless sheet resistance measurement apparatus of claim 9, wherein said transparent conducting electrode is a glass or quartz disk with an ITO coating covering central part of this disk and the non-transparent electrode is a metal arc coaxially installed to said glass or quartz disk, and a grounded electrode is surrounding these electrodes.

12. The contactless sheet resistance measurement apparatus of claim 9, wherein said illumination means comprises a light emitting diode with the drivers forming the sinusoidal illumination and an optical fiber directing the light onto the wafer surface.

13. The contactless sheet resistance measurement apparatus of claim 9, wherein said illumination means comprises a laser diode with the drivers forming a sinusoidal illumination and an optical fiber directing the light onto the wafer surface.

14. The contactless sheet resistance measurement apparatus claim 9, wherein said means for detecting of JPV signals comprises a transparent conducting electrode optically coupled with a light source used for detecting JPV signals inside the illumination area, a non-transparent electrode used for detecting JPV signals outside the illumination area, and a grounded electrode surrounding said electrodes.

15. The contactless sheet resistance measurement apparatus of claim 9, wherein said means for monitoring and adjustment the air gap between wafer and electrodes includes vertical motion control and a sensor for measuring of the air gap between junction and electrode.

16. The contactless sheet resistance measurement apparatus as in any one of claims 9–15, wherein said means measuring the air gap between wafer and electrodes is a laser based distance sensor placed close the electrode.

17. The contactless sheet resistance measurement apparatus as in any one of claims 9–15, wherein the means for measuring the air gap between wafer and electrode is measuring the capacitance coupling between the electrodes and the wafer.

18. The contactless sheet resistance measurement apparatus claim 15, wherein said means for measuring the air gap between wafer and electrode is by measuring wafer thickness and comparison with the reference wafer thickness.

19. A contactless sheet resistance measurement apparatus of claim 9, wherein said calibration means comprises a photodetector optically coupled to a transparent electrode.

* * * * *